(12) United States Patent
Sfikas et al.

(10) Patent No.: US 9,344,098 B1
(45) Date of Patent: May 17, 2016

(54) DIGITAL FREQUENCY-LOCKED LOOP WITH REFERENCE CLOCK ERROR DETECTION

(71) Applicant: Broadcom Corporation, Irvine, CA (US)

(72) Inventors: Georgios Sfikas, Glyfada (GR); Jianfeng Shi, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/720,128

(22) Filed: May 22, 2015

(30) Foreign Application Priority Data

May 22, 2015 (GR) ............................... 20150100232

(51) Int. Cl.
H03L 7/06 (2006.01)
H03L 7/099 (2006.01)
H03L 7/085 (2006.01)

(52) U.S. Cl.
CPC .............. *H03L 7/0991* (2013.01); *H03L 7/085* (2013.01)

(58) Field of Classification Search
USPC .................................. 327/147–149, 156–158
See application file for complete search history.

(56) References Cited

U.S. PATENT DOCUMENTS

| | | | | | |
|---|---|---|---|---|---|
| 5,022,048 | A | * | 6/1991 | Kingston | ............ H04L 27/2332 327/231 |
| 5,657,215 | A | * | 8/1997 | Faulk | ................. H02M 3/33507 363/41 |
| 7,327,295 | B1 | * | 2/2008 | Trotter | ..................... H03K 7/08 341/143 |
| 7,888,973 | B1 | * | 2/2011 | Rezzi | ....................... H03L 7/085 327/105 |
| 2011/0122008 | A1 | * | 5/2011 | Mahooti | ................ H03M 1/069 341/142 |

* cited by examiner

*Primary Examiner* — Adam Houston
(74) *Attorney, Agent, or Firm* — Sterne, Kessler, Goldstein & Fox P.L.L.C.

(57) ABSTRACT

The present disclosure is directed to a system and method for generating an output oscillating signal using an input oscillating signal that is subject to missing pulses and/or distortions. The output oscillating signal can be generated at a desired frequency by a frequency-locked loop (FLL) that uses the input oscillating signal as a reference clock. Because the input oscillating signal is used as a reference clock, missing pulses and/or distortions in the input oscillating signal can adversely affect the continued, stable generation of the output oscillating signal. To this end, the system and method of the present disclosure use an input oscillating signal error detector to open the FLL upon detecting a missing pulse in the input oscillating signal and/or a distortion in the input oscillating signal.

20 Claims, 3 Drawing Sheets

DIGITAL FREQUENCY-LOCKED LOOP WITH REFERENCE CLOCK ERROR DETECTION

TECHNICAL FIELD

This application relates generally to frequency-locked loops (FLLs), including digital FLLs (DFLLs).

BACKGROUND

A frequency locked loop (FLL) uses a controllable oscillator (e.g., a digitally controlled oscillator) to generate an output oscillating signal at a desired frequency from a given input oscillating signal that has a known frequency. Because the input oscillating signal has a known frequency, the input oscillating signal is often referred to as a reference clock.

In certain applications of FLLs, the input oscillating signal can be subject to missing pulses and/or distortions that can adversely affect the continued, stable generation of the output oscillating signal. For example, when implemented in a first near field communication (NFC) device that uses a recovered sinusoidal carrier signal transmitted by a second NFC device as the input oscillating signal, the input oscillating signal can be heavily distorted due to the way the second NFC device modulates information on the carrier (e.g., using amplitude modulation). The distortions can be so heavy that one or more of the carrier's pulses that repetitively occur at the frequency of the carrier can be effectively missing and/or distorted to such a high-degree that the recovered carrier will affect the continued, stable generation of the output oscillating signal at the desired frequency.

In such an application, the output oscillating signal can be used by the first NFC device to, for example, process signals received from the second NFC device and/or to generate signals for transmission to the second NFC device.

BRIEF DESCRIPTION OF THE DRAWINGS/FIGURES

The accompanying drawings, which are incorporated herein and form a part of the specification, illustrate the present disclosure and, together with the description, further serve to explain the principles of the disclosure and to enable a person skilled in the pertinent art to make and use the disclosure.

The present disclosure will be described with reference to the accompanying drawings. The drawing in which an element first appears is typically indicated by the leftmost digit(s) in the corresponding reference number.

DETAILED DESCRIPTION

Figure 1:
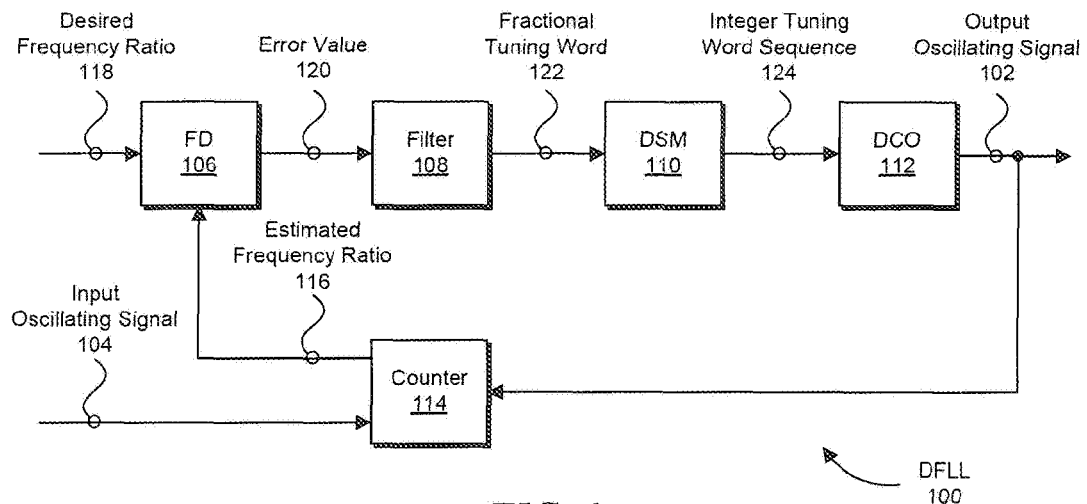
FIG. 1 illustrates an exemplary digital frequency locked loop (DFLL) in accordance with embodiments of the present disclosure.

In the following description, numerous specific details are set forth in order to provide a thorough understanding of the disclosure. However, it will be apparent to those skilled in the art that the disclosure, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of this discussion, the elements in FIGS. 1-4 shall be understood to include software, firmware, or hardware (such as one or more circuits, microchips, processors, and/or devices), or any combination thereof. In addition, it will be understood that each element in FIGS. 1-4 can include one, or more than one, component within an actual device, and each component that forms a part of the described element can function either cooperatively or independently of any other component forming a part of the element. Conversely, multiple elements described herein can represent a single component within an actual device. Further, components within an element can be in a single device or distributed among multiple devices in a wired or wireless manner.

1. Overview

The present disclosure is directed to a system and method for generating an output oscillating signal using an input oscillating signal that is subject to missing pulses and/or distortions. In one embodiment, the output oscillating signal is generated at a desired frequency by a frequency-locked loop (FLL) that uses the input oscillating signal as a reference clock. Because the input oscillating signal is used as a reference clock, missing pulses and/or distortions in the input oscillating signal can adversely affect the continued, stable generation of the output oscillating signal.

To this end, the system and method of the present disclosure use an input oscillating signal error detector to open the FLL upon detecting a missing pulse in the input oscillating signal and/or a distortion in the input oscillating signal. More specifically, the input oscillating signal error detector is configured to open the loop such that the portion of the input oscillating signal that is missing a pulse and/or that contains a distortion is substantially prevented from adversely affecting the continued, stable generation of the output oscillating signal at a desired frequency. In one embodiment, the input oscillating signal error detector opens the loop by controlling a filter and/or a delta-sigma modulator that function within the FLL. These and other features of the present disclosure are described further below.

2. Digital Frequency Locked Loop

FIG. 1 illustrates an exemplary block diagram of a digital frequency locked loop (DFLL) 100 in accordance with embodiments of the present disclosure. In general, the DFLL 100 is used to generate an output oscillating signal 102 having a desired output frequency ($f_{out}$) from an input oscillating signal 104 having a given reference frequency ($f_{ref}$). The output oscillating signal 102 is a relatively high frequency signal and the input oscillating signal 104 is a relatively low frequency signal (i.e., $f_{out} > f_{ref}$). Accordingly, the DFLL 100 is used to generate the high frequency output oscillating signal 102 from the lower frequency input oscillating signal 104. The input oscillating signal 104 can be referred to as a reference clock.

As shown in FIG. 1, the DFLL 100 includes a frequency detector (FD) 106, a filter 108, a delta-sigma modulator 110, a digitally controlled oscillator (DCO) 112, and a counter 114. The DFLL is arranged as a negative feedback system. An output of the DCO 112 provides the output oscillating signal 102. The counter 114 generates an estimated frequency ratio 116 of the frequency of the output oscillating signal 102 to the frequency of the input oscillating signal 104. To estimate the ratio of the frequency of the output oscillating signal 102 to the frequency of the input oscillating signal 104, the counter 114 can count the number of rising or falling edges in the output oscillating signal during a cycle of the input oscillating signal 104.

The FD 106 compares the estimated frequency ratio 116 to a desired frequency ratio 118 and generates an error value 120 proportional to any difference between the estimated frequency ratio 116 and the desired frequency ratio 118. The desired frequency ratio 118 can be an integer or an integer plus a fractional value. The filter 108 accumulates samples of error value 120 and smooths the resulting accumulated value to provide a fractional tuning word 122. The fractional tuning word 122 is used to adjust the frequency of the output oscillating signal 102 provided by the DCO 112 to correct for any difference between the estimated frequency ratio 116 and the desired frequency ratio 118. In this way, the DFLL 100 uses feedback to continuously monitor and adjust the frequency of the output oscillating signal 102.

Because the DCO 112 is typically controlled based on an integer tuning word, the DSM 110 can be used to first process the fractional tuning word 122 to provide as output an integer tuning word sequence 124 with an average value substantially equal to the fractional tuning word 122. The DSM 110 generates the integer tuning word sequence 124 by rapidly switching between two or more different integer tuning word values. For example, the DSM 110 can generate a fractional tuning word of 1.5, by applying a sequence of tuning words 1 and 2 over alternating and equal time periods.

Figure 2:
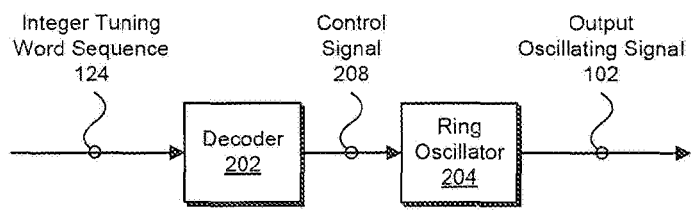
FIG. 2 illustrates an exemplary digital controlled oscillator (DUO) in accordance with embodiments of the present disclosure.

FIG. 2 illustrates an exemplary implementation of the DCO 112 according to embodiments of the present disclosure. As shown in the embodiment of FIG. 2, the DCO 112 includes a decoder 202 and a ring oscillator 204 with a programmable frequency. Decoder 202 formats the tuning words in the integer tuning word sequence 124 for the particular implementation of the ring oscillator 204. More specifically, the decoder 202 formats the tuning words in the integer tuning word sequence 124 into a control signal 208 that is suitable to control the ring oscillator 204 such that the ring oscillator 204 provides the output oscillating signal 102 at a frequency designated by the tuning words of the integer tuning word sequence 124.

For example, the tuning words in integer tuning word sequence 124 can be digital values and the frequency of the ring oscillator 204 can be controlled by a voltage (i.e., ring oscillator 204 is a voltage controlled ring oscillator). In this instance, the decoder 202 can format the digital value of the tuning words in integer tuning word sequence 124 into suitable voltage signals to control the ring oscillator 204 such that the ring oscillator 204 provides the output oscillating signal 102 at the frequencies designated by the digital values of the tuning words in the integer tuning word sequence 124.

Figure 3:
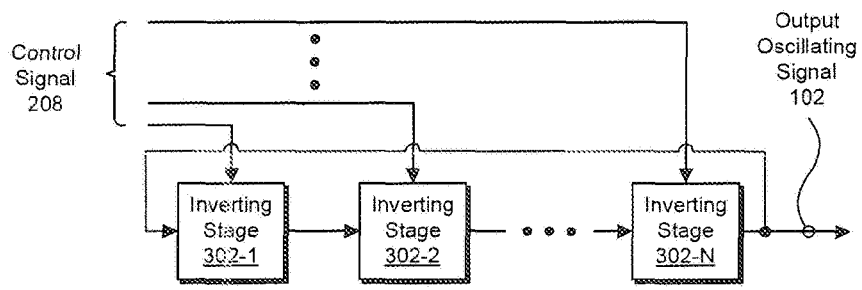
FIG. 3 illustrates an exemplary ring oscillator for a DFLL in accordance with embodiments of the present disclosure.

FIG. 3 illustrates an exemplary implementation of the ring oscillator 204 in accordance with embodiments of the present disclosure. As shown in FIG. 3, the ring oscillator 204 includes a plurality of inverting stages 302-1 through 302-N that are coupled in series. Each inverting stage 302-1 through 302-N receives and inverts the output of one of the other inverting stages 302-1 through 302-N. For example, the inverting stage 302-2 receives and inverts the output of the inverting stage 302-1 and provides the inverted output to the inverting stage 302-3 (not shown). The output of the last inverting stage 302-N provides the output oscillating signal 102 and is fed back to the input of the first inverting stage 302-1.

In an embodiment, the ring oscillator 204 includes an odd number of inverting stages 302-1 through 302-N. Given that there is an odd number of inverting stages 302-1 through 302-N, it can be shown that the output of the inverting stage 302-N is the logical NOT or inversion of the initial input to the inverting stage 302-1. Because each of the inverting stages 302-1 through 302-N has an associated delay from the time its input changes to the time its output changes (referred to as a stage or gate delay), the output of the inverting stage 302-N will be asserted some non-zero amount of time after the initial input to the inverting stage 302-1 is asserted. When the output of the inverting stage 302-N eventually responds to the initial input of the inverting stage 302-1 and is fed back to the input of the inverting stage 302-1, the feedback will cause oscillation of the output oscillating signal 102. The frequency of oscillation is approximately equal to the reciprocal of twice the sum of the individual delays of all the inverting stages 302-1 through 302-N included in the ring oscillator 204.

In an embodiment, the ring oscillator 204 can further include non-inverting or buffer stages coupled between the inverting stages 302-1 through 302-N. Because these buffer stages further contribute to delay, the frequency of oscillation of output oscillating signal 102 is approximately equal to the reciprocal of twice the sum of the individual delays of all the inverting stages 302-1 through 302-N and the buffer stages included in the ring oscillator 204.

Control signal 208 controls the stage or gate delay associated with the inverting stages 302-1 through 302-N (and possibly the stage or gate delay of any buffer stages included in the ring oscillator 204). By controlling the delay associated with the inverting stages 302-1 through 302-N, the control signal 208 can adjust the frequency of the output oscillating signal 102. Specifically, the control signal 208 can increase the delay associated with the inverting stages 302-1 through 302-N to decrease the frequency of the output oscillating signal 102. Conversely, the control signal 208 can decrease the delay associated with the inverting stages 302-1 through 302-N to increase the frequency of the output oscillating signal 102.

It should be noted that the inverting stages 302-1 through 302-N can be implemented in either a single-ended or differential-ended configuration. In the instance where the inverting stages 302-1 through 302-N are implemented in a differential-ended configuration, the inverting stages can provide more immunity to noise that couples (commonly) to their differential inputs. In addition, in the instance where the inverting stages 302-1 through 302-N are implemented in a differential-ended configuration, it is possible to use an even number of the inverting stages 302-1 through 302-N to provide oscillation. For example, if the differential output lines of the inverting stage 302-N are swapped before being coupled to the differential input of the inverting stage 302-1, an even number of the inverting stages 302-1 through 302-N can be used.

3. Reference Clock Error Detection

In certain applications of DFLL 100 in FIG. 1, the input oscillating signal 104 can be subject to missing pulses and/or distortions that can adversely affect the continued, stable generation of the output oscillating signal 102. For example, when DFLL 100 is implemented in a first NFC device that uses a recovered sinusoidal carrier signal transmitted by a second NFC device as the input oscillating signal 104, the input oscillating signal 104 can be heavily distorted due to the way the second NFC device modulates information on the carrier (e.g., using amplitude modulation). The distortions can be so heavy that one or more of the carrier's pulses that repetitively occur at the frequency of the carrier can be effectively missing and/or distorted to such a high-degree that the recovered carrier will affect the continued, stable generation of the output oscillating signal 102. In such an application, the output oscillating signal 102 can be used by the first NFC device to, for example, process signals received by the second NFC device and/or to generate signals for transmission to the second NFC device.

To prevent (or at least substantially prevent) missing and/or distorted pulses in the input oscillating signal 104 from adversely affecting the continued, stable generation of the output oscillating signal 102, the system and method of the present disclosure use an input oscillating signal error detector to open the DFLL 100 upon detecting a missing pulse in the input oscillating signal 104 and/or a large distortion in the input oscillating signal 104.

Figure 4:
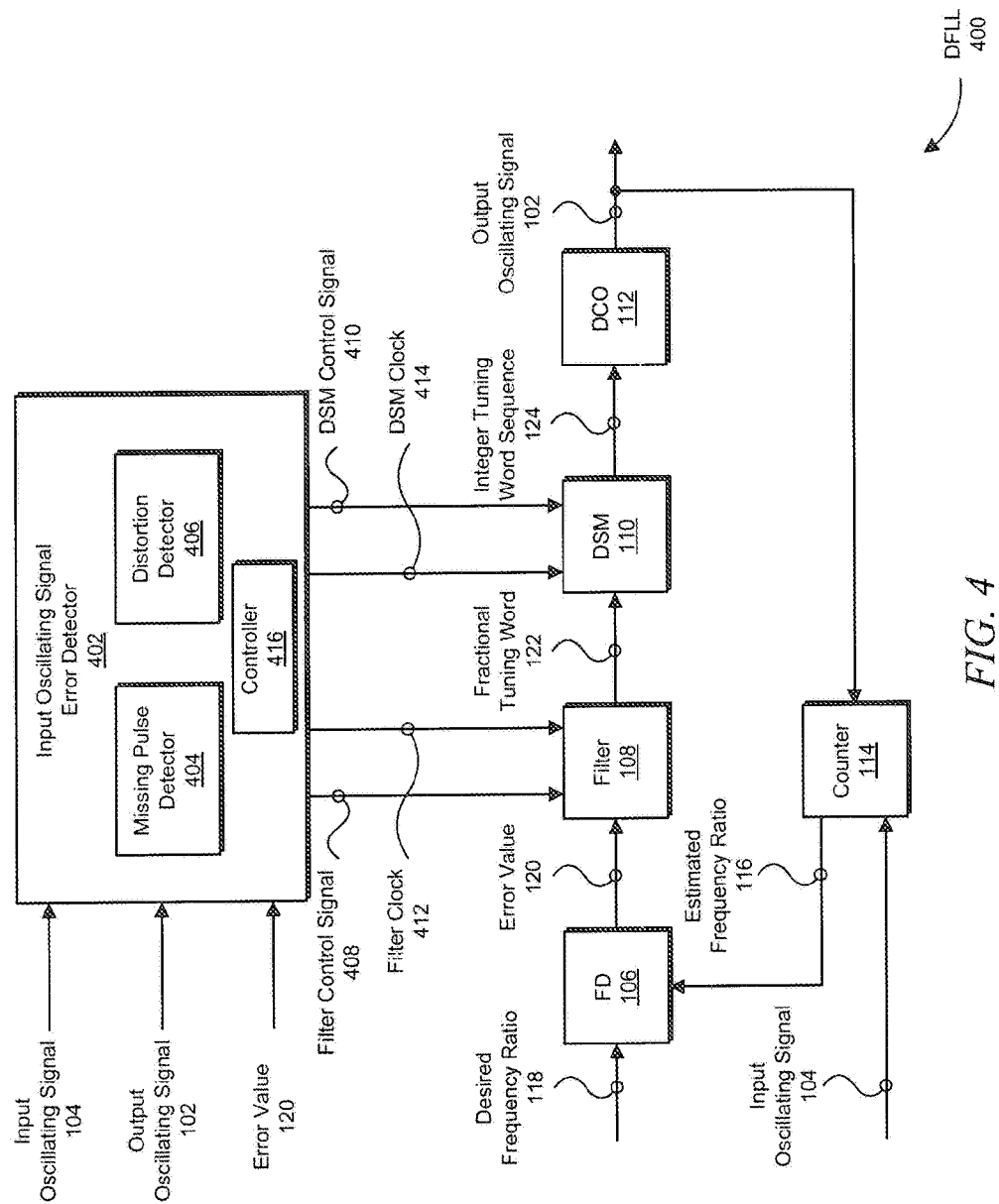
FIG. 4 illustrates an exemplary DFLL with an input oscillating signal error detector in accordance with embodiments of the present disclosure.

Referring now to FIG. 4, a DFLL 400 is illustrated with a similar configuration as the DFLL 100 in FIG. 1 but with the addition of an input oscillating signal error detector 402. The input oscillating signal error detector 402 is configured to open the DFLL 400 such that a portion of the input oscillating signal 104 that is missing a pulse and/or that contains a large distortion is substantially prevented from adversely affecting the continued, stable generation of the output oscillating signal 102 at a desired frequency.

Before detailing the specific ways in which the input oscillating signal error detector 402 can open the DFLL 400, the detection techniques that can be used by the input oscillating signal error detector 402 to detect a portion of the input oscillating signal 104 that is missing a pulse and/or that contains a large distortion are described. As shown in FIG. 4, the input oscillating signal error detector 402 specifically includes two detectors in this regard: a missing pulse detector 404 and a distortion detector 406.

The missing pulse detector 404 is configured to detect a portion of the input oscillating signal 104 that is missing a pulse. A pulse in the input oscillating signal 104 is expected to occur every t seconds, where t is given by the inverse of the frequency of the input oscillating signal 104. To detect the occurrence of a missing pulse in the input oscillating signal 104, the missing pulse detector 404 can use a sampler to oversample the input oscillating signal 104 using, for example, the output oscillating signal 102, which as described above has a higher frequency than the input oscillating signal 104. If a pulse in the input oscillating signal 104 is not detected within some number of samples n of the input oscillating signal 104 that span an approximate period of time equal to t, then the missing pulse detector 404 can signal the occurrence of a missing pulse in the input oscillating signal 104.

The distortion detector 406 is configured to detect a portion of the input oscillating signal 104 that contains a large distortion. In one embodiment, the distortion detector 406 specifically detects a portion of the input oscillating signal 104 that contains a large distortion by analyzing the error value 120 provided as output by FD 106. In general, after the DFLL 400 is in lock, the error value 120 will tend to be very close to zero. A large distortion in the input oscillating signal 104, however, can cause the error value 120 to increase or decrease unexpectedly in magnitude. The distortion detector 406 thus detects a large distortion in the input oscillating signal 104 based on the error value being above or below a particular range of values around zero. For example, and in one embodiment, the distortion detector 406 is configured to signal the detection of a large distortion in the input oscillating signal 104 when the error value 120 is above or below the range of error values −1 to +1.

After the detection of either a missing pulse in the input oscillating signal 104 by the missing pulse detector 404 or the detection of a large distortion in the input oscillating signal 104 by the distortion detector 406, the input oscillating signal error detector 402 can open the DFLL 400. More specifically, the input oscillating signal error detector 402 can open the DFLL 400 by controlling the filter 108, using a filter control signal 408, and/or by controlling the DSM 110, using a DSM control signal 410, such that the portion of the input oscillating signal 104 containing the missing pulse or the distortion does not affect the continued, stable generation of the output oscillating signal 102.

For example, based on the detection of a missing pulse in the input oscillating signal 104 or a distortion in the input oscillating signal 104, the input oscillating signal error detector 402 can control filter 108, using the filter control signal 408, to not generate the fractional tuning word 122 based on (at least not directly) the error value 120 corrupted by the missing pulse or distortion in the input oscillating signal 104. Instead, the input oscillating signal error detector 402 can control filter 108, using the filter control signal 408, to generate the fractional tuning word 122 based on an error value of −1 or +1 that is determined based on a sign of the corrupted error value 120. For example, if the corrupted error value 120 is negative, the filter 108 can generate the fractional tuning word 122 based on an error value of −1. On the other hand, if the corrupted error value 120 is positive, the filter 108 can generate the fractional tuning word 122 based on an error value of +1.

As an alternative to the above, the input oscillating signal error detector 402 can control the filter 108 to completely ignore the corrupted error value 120 by gating a filter clock 412. The filter clock 412 is a clock signal used to clock the digital logic of the filter 108. As described above, the filter 108 is used to accumulate samples of the error value 120 and smooth the resulting accumulated value. Samples of the error value 120 are taken and added to the accumulated value in synchronism with the filter clock 412. The input oscillating signal error detector 402 can gate the filter clock 412 (i.e., prevent the filter clock from oscillating for some period of time) such that the corrupted error value 120 is not sampled by the filter 108 and added to the accumulated value held by the filter 108. The result being that the previous output of the filter 108 (i.e., the previous value of the fractional tuning word 122) is maintained for at least an additional cycle of the filter clock 412.

In one embodiment, the filter clock 412 is generated by the input oscillating signal error detector 402 by dividing down the output oscillating signal 102 in frequency. The input oscillating signal error detector 402 can specifically divide down the output oscillating signal 102 such that the filter clock 412 has a frequency substantially equal to the frequency of the input oscillating signal 104.

Based on the detection of a missing pulse in the input oscillating signal 104 or a distortion in the input oscillating signal 104, the input oscillating signal error detector 402 can alternatively control the DSM 110, using the DSM control signal 414, to open the DFLL 400 by preventing the DSM 110 from using the fractional tuning word 122 corrupted by the missing pulse or distortion in the input oscillating signal 104. Instead, the input oscillating signal error detector 402 can control the DSM 110, using the DSM control signal 410, to generate the integer tuning word sequence 124 based on a previous value of the fractional tuning word 122 (e.g., the previous value of the fractional tuning word 122 that immediately preceded the current, corrupted value of the fractional tuning word 122). The previous value of the fractional tuning word 122 can be fed through the DSM control signal 410 and/or can be stored within a register or other memory in the DSM 110.

As an alternative to the above, the input oscillating signal error detector 402 can control the DSM 110 to completely ignore the corrupted fractional tuning word 122 by gating a DSM clock 414. The DSM clock 414 is a clock signal used to clock the digital logic of the DSM 110. As described above, the DSM 110 can be used to first process the fractional tuning word 122 to provide as output an integer tuning word sequence 124 with an average value substantially equal to the fractional tuning word 122. The DSM 110 samples the fractional tuning word 122 and provides the different values of the integer tuning word sequence 124 in synchronism with the DSM clock 414. The input oscillating signal error detector 402 can gate the DSM clock 414 (i.e., prevent the DSM clock 414 from oscillating for some period of time) such that the corrupted fractional tuning word 122 is not sampled by the DSM 110 and the different values of the integer tuning word sequence 124 are not determined based on the corrupted fractional tuning word 122.

It should be noted that the DFLL 400 is provided by way of example and not limitation. One of ordinary skill in the art will appreciate that the input oscillating signal error detector 402 can be used in DFLLs other than the DFLL 400 shown in FIG. 4 as would be appreciated by one of ordinary skill in the art. It should be further noted that a controller, such as controller 416 shown in FIG. 4, can be used to specifically generate filter control signal 408 and DSM control signal 410.

Figure 5:
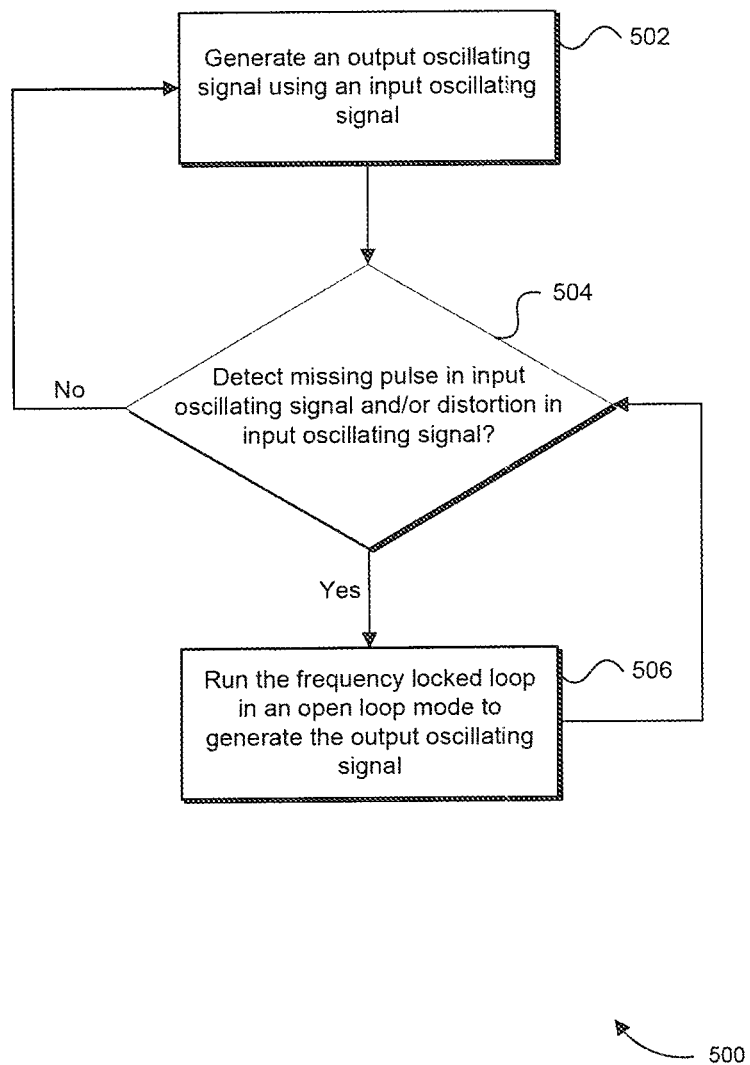
FIG. 5 illustrates an exemplary flowchart of a method for the continuous and stable generation of an output oscillating signal from an input oscillating signal subject to missing pulses and/or distortions in accordance with embodiments of the present disclosure.

Referring now to FIG. 5, a flowchart 500 of a method for the continuous and stable generation of an output oscillating signal generated by a DFLL from an input oscillating signal that is subject to missing pulses and/or distortions is illustrated in accordance with embodiments of the present disclosure. The method of flowchart 500 can be implemented by the DFLL 400 as described above in reference to FIG. 4. However, it should be noted that the method can be implemented by other DFLLs as well.

The method of flowchart 500 begins at step 502. At step 502, the DFLL generates an output oscillating signal at a desired frequency using an input oscillating signal, with a known frequency, such as a reference clock.

After step 502, the method of flowchart 500 proceeds to step 504. At step 504, a determination is made as to whether a missing pulse in the input oscillating signal and/or a distortion in the input oscillating signal has been detected. If no missing pulse and/or distortion in the input oscillating signal is detected, the method of flowchart 500 proceeds back to step 502 and normal generation of the output oscillating signal resumes.

On the other hand, if a missing pulse and/or distortion in the input oscillating signal is detected, the method of flowchart 500 proceeds to step 504. At step 504, the DFLL is opened (i.e., run in an open loop mode) to generate the output oscillating signal. The DFLL is opened to prevent the portion of the input oscillating signal containing the missing pulse and/or the distortion from affecting the continued, stable generation of the output oscillating signal at a desired frequency. Several different techniques for opening the DFLL were described above with respect to FIG. 4.

4. Conclusion

Embodiments have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

What is claimed is:

1. A system, comprising:
a digitally controlled oscillator (DCO) configured to generate an output oscillating signal based on a first sequence of integer tuning words;
a counter configured to estimate a ratio of a frequency of the output oscillating signal to a frequency of an input oscillating signal to generate an estimated frequency ratio;
a frequency detector configured to compare the estimated frequency ratio to a desired frequency ratio to generate an error value;
a low-pass filter (LPF) configured to receive the error value and generate a current fractional tuning word;
a delta-sigma modulator (DSM) configured to receive the current fractional tuning word and generate a second sequence of integer tuning words for the DCO; and
an input oscillating signal error detector configured to open a loop based on a missing pulse in the input oscillating signal or a distortion in the input oscillating signal, wherein the loop includes the DCO, the counter, the frequency detector, the LPF, and the DSM.

2. The system of claim 1, wherein the input oscillating signal error detector is further configured to oversample the input oscillating signal to detect the missing pulse.

3. The system of claim 1, wherein the input oscillating signal error detector is further configured to determine whether the error value is above or below a particular range of error values to detect the distortion in the input oscillating signal.

4. The system of claim 3, wherein the range of error values is −1 to +1.

5. The system of claim 1, wherein the input oscillating signal error detector is further configured to open the loop by preventing the DSM from generating the second sequence of integer tuning words for the DCO based on the current fractional tuning word.

6. The system of claim 1, wherein the input oscillating signal error detector is further configured to open the loop by freezing a DSM clock used to clock the DSM.

7. The system of claim 1, wherein the input oscillating signal error detector is further configured to open the loop by controlling the DSM to generate the second sequence of integer tuning words based on a previous fractional tuning word provided by the LPF before the current fractional tuning word.

8. The system of claim 1, wherein the input oscillating signal error detector is further configured to open the loop by preventing the LPF from generating the current fractional tuning word based on the error value.

9. The system of claim 1, wherein the input oscillating signal error detector is further configured to open the loop by freezing an LPF clock used to clock the LPF.

10. The system of claim 1, wherein the input oscillating signal error detector is further configured to open the loop by controlling the LPF to generate the current fractional tuning word based on a value of −1 or +1 determined based on a sign of the error value.

11. The system of claim 1, wherein the input oscillating signal error detector is configured to generate an LPF clock for clocking the LPF based on the output oscillating signal.

12. The system of claim 1, wherein the input oscillating signal error detector is configured to generate a DSM clock for clocking the DSM based on the output oscillating signal.

13. The system of claim 1, wherein the loop is used in an NFC or RFID application.

14. The system of claim 1, wherein the input oscillating signal is received from a transmitter of an NFC or RFID device.

15. A system, comprising:
a frequency-locked loop (FLL) configured to generate an output oscillating signal using an input oscillating signal; and
an input oscillating signal error detector configured to open the FLL based on a missing pulse in the input oscillating signal or a distortion in the input oscillating signal.

16. The system of claim 15, wherein the input oscillating signal error detector is further configured to oversample the input oscillating signal to detect the missing pulse.

17. The system of claim 1, wherein the input oscillating signal error detector is further configured to determine whether a difference between a desired frequency ratio and an estimated frequency ratio of the output oscillating signal to the input oscillating signal is above or below a particular range to detect the distortion in the input oscillating signal.

18. A method, comprising:
generating an output oscillating signal using an input oscillating signal using a frequency-locked loop (FLL); and
opening the FLL based on a missing pulse in the input oscillating signal or a distortion in the input oscillating signal.

19. The method of claim 18, further comprising:
oversampling the input oscillating signal to detect the missing pulse.

20. The method of claim 18, further comprising:
determining whether a difference between a desired frequency ratio and an estimated frequency ratio of the output oscillating signal to the input oscillating signal is above or below a particular range to detect the distortion in the input oscillating signal.

* * * * *